(12) United States Patent
Akaogi et al.

(10) Patent No.: US 7,312,641 B2
(45) Date of Patent: Dec. 25, 2007

(54) SENSE AMPLIFIERS WITH HIGH VOLTAGE SWING

(75) Inventors: Takao Akaogi, Cupertino, CA (US); Sameer Wadhwa, Santa Clara, CA (US); Michael Achter, Mountain View, CA (US); Bhimachar Venkatesh, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 82 days.

(21) Appl. No.: 11/024,257

(22) Filed: Dec. 28, 2004

(65) Prior Publication Data

US 2006/0139062 A1 Jun. 29, 2006

(51) Int. Cl.
*G01R 19/00* (2006.01)
*G11C 7/00* (2006.01)

(52) U.S. Cl. .......................... 327/51; 327/56
(58) Field of Classification Search ............... None
See application file for complete search history.

(56) References Cited

U.S. PATENT DOCUMENTS

| | | | | |
|---|---|---|---|---|
| 4,799,195 A | * | 1/1989 | Iwahashi et al. ....... | 365/185.21 |
| 5,301,149 A | * | 4/1994 | Jinbo .................... | 365/185.21 |
| 5,638,322 A | * | 6/1997 | Lacey .................... | 365/185.2 |
| 5,717,640 A | * | 2/1998 | Hashimoto ............. | 365/189.07 |
| 5,856,748 A | * | 1/1999 | Seo et al. ................. | 327/53 |
| 6,542,409 B2 | * | 4/2003 | Yamada .................. | 365/185.2 |

OTHER PUBLICATIONS

Ph.D. Dissertation at Stanford University entitled "Virtual-Ground Sensing Techniques for Fast, Low-Power, 1.8V, Two-Bit-Per-Cell Flash Memories" by Binh Quang Le, dated Nov. 2003.

* cited by examiner

*Primary Examiner*—Tuan T Lam
(74) *Attorney, Agent, or Firm*—Monica H. Choi

(57) ABSTRACT

A sense amplifier includes a reference voltage generator for generating a reference output voltage and a core output voltage generator for generating a core output voltage. The core output voltage generator includes a core front-end stage and a core back-end stage or includes a plurality of amplifier transistors each conducting a portion of a core current through a current conducting device such as core cell. The sizes and/or connections of transistors of such components result in high voltage swing and thus high sensitivity of the sense amplifier.

16 Claims, 8 Drawing Sheets

SENSE AMPLIFIERS WITH HIGH VOLTAGE SWING

TECHNICAL FIELD

The present invention relates generally to sense amplifiers, and more particularly, to sense amplifier circuits with high voltage swing for enhanced sensitivity.

BACKGROUND OF THE INVENTION

Referring to FIG. 1, a sense amplifier 100 of the prior art is used for determining the bit data of a core cell 102 that is typically part of a memory device. A current level $(I_R+\Delta i)$ through the core cell 102 varies depending on the bit data stored therein. A core bit voltage $V_{CBIT}$ is generated at a source of a first NMOSFET (N-channel metal oxide semiconductor field effect transistor) 104 from the core cell 102.

The source of the first NMOSFET 104 and the core cell 102 are coupled to a negative input 108 of a first differential amplifier 106 that compares the core bit voltage $V_{CBIT}$ with a regulation reference voltage $V_{REG\_REF}$ applied on a positive input 110 of the first differential amplifier 106. The output of the first differential amplifier 106 is coupled to a gate of the first NMOSFET 104 for stably maintaining the core bit voltage $V_{CBIT}$.

A drain of the first NMOSFET 104 is coupled to a positive voltage supply $V_{CC}$ via a first resistor 112. A core output voltage $V_{CORE}$ is generated at the drain of the first NMOSFET 104 and is applied on a negative input of a comparator 120.

The sense amplifier 100 also includes a second NMOSFET 122 having a source coupled to a reference cell 124. A current level $I_R$ flows through the reference cell 124, and a reference bit voltage $V_{RBIT}$ is generated at the source of the second NMOSFET 122 from the reference cell 124.

The source of the second NMOSFET 122 and the reference cell 124 are coupled to a negative input 126 of a second differential amplifier 128 that compares the reference bit voltage $V_{RBIT}$ with the regulation reference voltage $V_{REG\_REF}$ applied on a positive input 130 of the second differential amplifier 128. The output of the second differential amplifier 130 is coupled to a gate of the second NMOSFET 122 for stably maintaining the reference bit voltage $V_{RBIT}$.

A drain of the second NMOSFET 122 is coupled to a positive voltage supply $V_{CC}$ via a second resistor 132. A reference output voltage $V_{REF}$ is generated at the drain of the second NMOSFET 122 and is applied on a positive input of the comparator 120.

The output of the comparator generates an output signal OUT that is a logical high state or a logical low state depending on the core output voltage $V_{CORE}$ compared to the reference output voltage $V_{REF}$. Such a logical high or low state of the output signal OUT indicates the bit data stored within the core cell 102.

The current $(I_R+\Delta i)$ through the core cell has a current offset component $\Delta i$ from the reference current $I_R$ through the reference cell 124 that varies depending on the bit data stored within the core cell 102. Such a variable current offset component $\Delta i$ determines the core output voltage $V_{CORE}$ which in turn determines the logical state of the output signal OUT.

Unfortunately, the core output voltage $V_{CORE}$ in the sense amplifier 100 of the prior art has limited voltage swing because the core bit voltage $V_{CBIT}$ is relatively high and substantially close to the positive supply voltage $V_{CC}$ for proper operation of the core cell 102. For example, when the positive supply voltage $V_{CC}$ is about 1.8 Volts, the core bit voltage $V_{CBIT}$ is about 1.5 Volts for proper operation of the core cell 102. In addition, a voltage drop is generated across the first resistor 112. Thus for such example voltages, the core output voltage $V_{CORE}$ has a voltage swing of from about 0.2 Volts to about 0.3 Volts for maintaining the first NMOSFET 104 in saturation.

Such a low voltage swing of the core output voltage $V_{CORE}$ disadvantageously results in low sensitivity of the sense amplifier 100 in the prior art. Thus, sense amplifiers having higher voltage swing are desired for higher sensitivity.

SUMMARY OF THE INVENTION

In one embodiment of the present invention, a sense amplifier includes a reference voltage generator for generating a reference output voltage. In addition, the sense amplifier also includes a core output voltage generator for generating a core output voltage. The core output voltage generator includes a core front-end stage and a core back-end stage. The core front-end stage is coupled to a current conducting device for converting a core current through the current conducting device to a core bit voltage. The core back-end stage is coupled to the core front-end stage for converting the core bit voltage to the core output voltage having higher voltage swing from the core bit voltage.

The sense amplifier may be used to particular advantage when the current conducting device is a core cell of a memory device. However, the present invention may also be used for sensing the current level through any type of current conducting device.

In another embodiment of the present invention, the core output voltage generator includes a plurality of amplifier transistors each conducting a portion of a core current through the current conducting device. A gate of a selected one of the amplifier transistors has the core output voltage generated thereon. A width to length (W/L) ratio of the selected amplifier transistor is minimized such that the core output voltage has high voltage swing.

In this manner, such sense amplifiers have high voltage swing for high sensitivity. These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
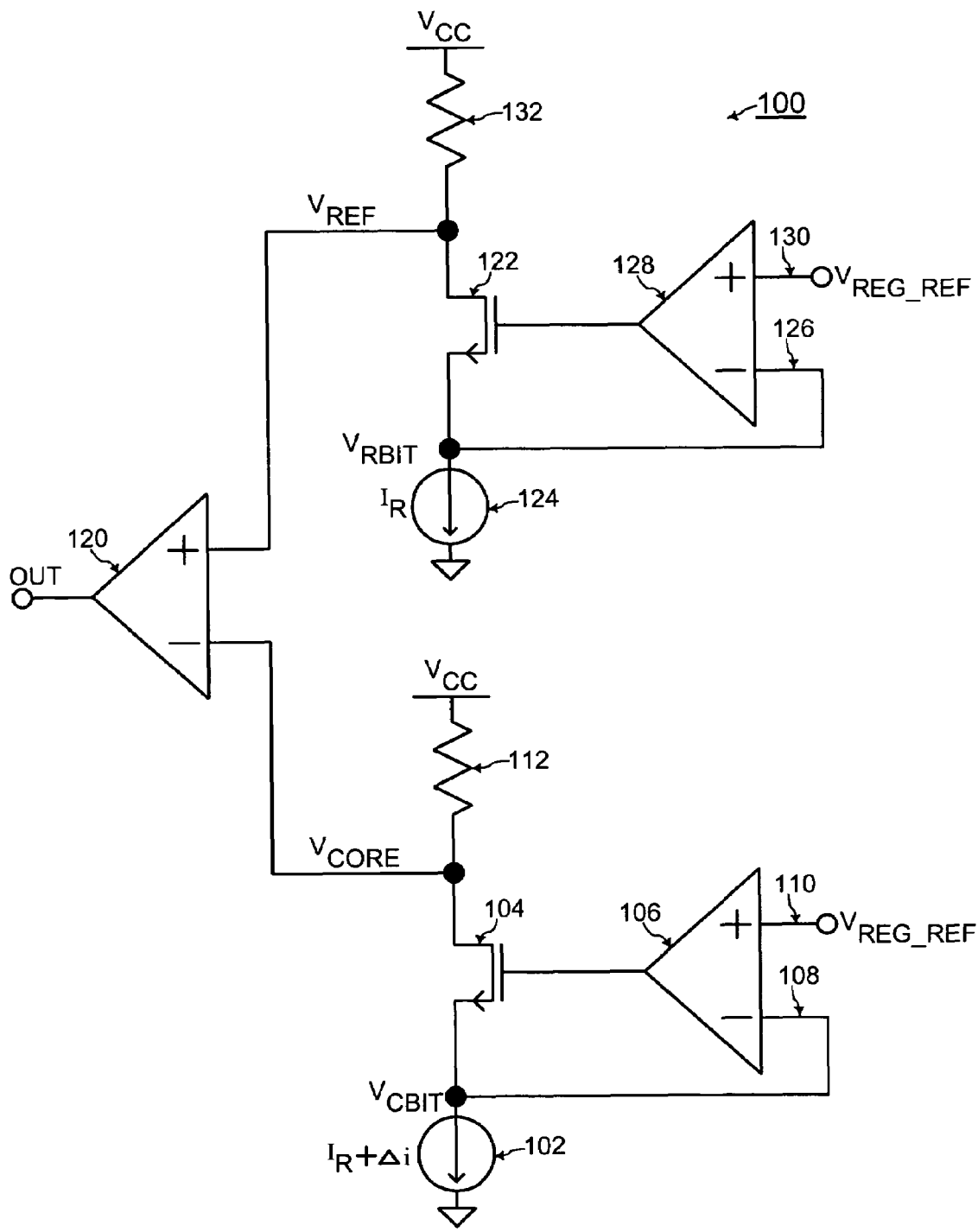
FIG. 1 shows a sense amplifier having lower voltage swing according to the prior art.
Figure 2:
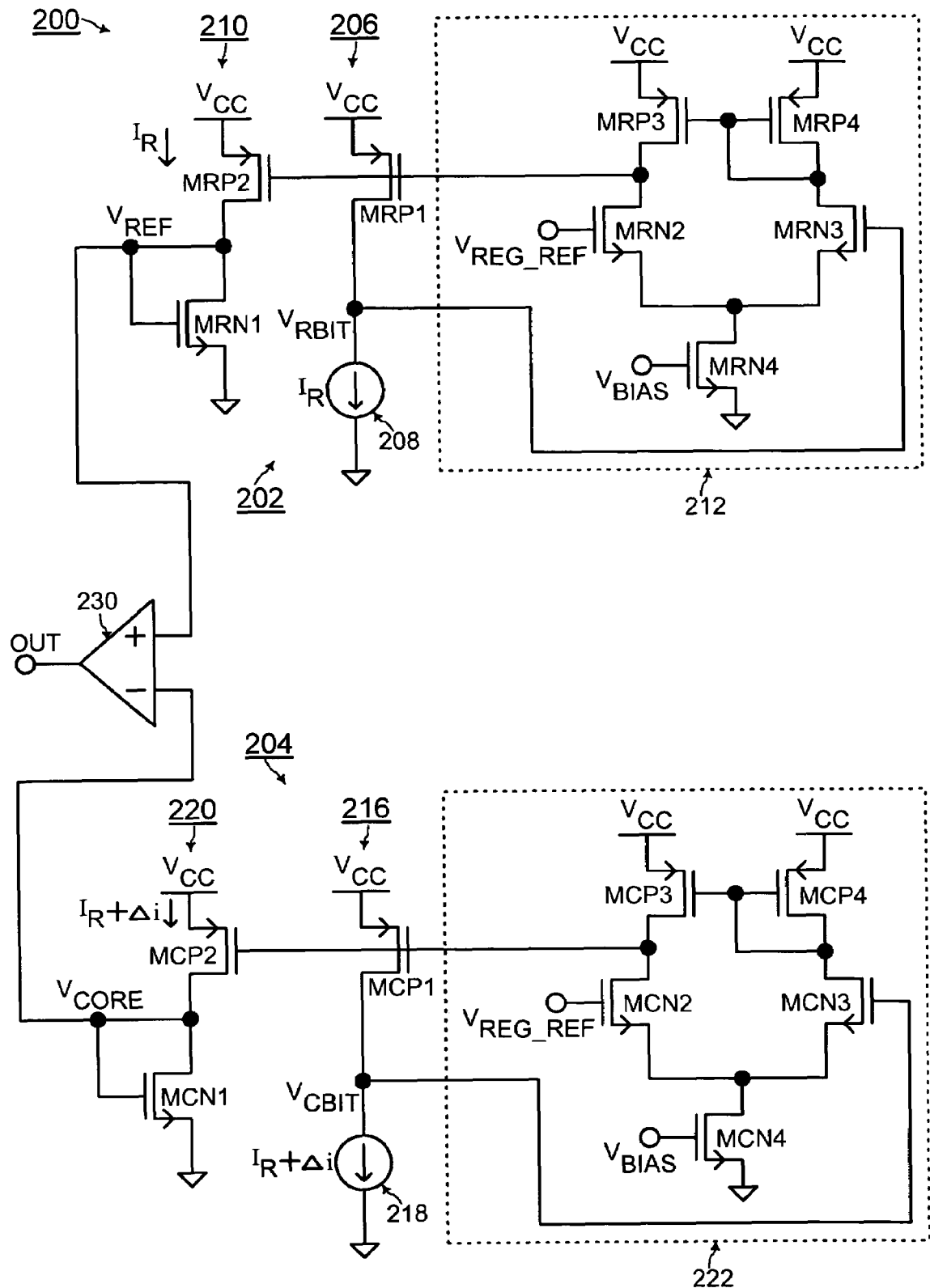
FIG. 2 shows a sense amplifier with front-end and back-end stages for high voltage swing, according to an embodiment of the present invention.

FIG. 2 shows a circuit diagram of a sense amplifier 200 having high voltage swing according to an embodiment of the present invention. The sense amplifier 200 includes a reference voltage generator 202 for generating a reference output voltage $V_{REF}$, and includes a core output voltage generator 204 for generating a core output voltage $V_{CORE}$.

The reference voltage generator 202 includes a reference front-end stage 206 comprised of a reference regulation transistor MRP1 coupled to a reference cell 208 having a reference current $I_R$ flowing there-through. A reference bit voltage $V_{RBIT}$ is generated at a node for coupling a drain of the first reference PMOSFET (P-channel metal oxide semiconductor field effect transistor) MRP1 and the reference cell 208. A source of the first reference PMOSFET MRP1 is coupled to a positive power supply $V_{CC}$.

The reference voltage generator 202 also includes a reference back-end stage 210 coupled to the reference front-end stage 206. The reference back-end stage 210 is comprised of a second reference PMOSFET MRP2 and a first reference NMOSFET (N-channel metal oxide semiconductor field effect transistor) MRN1. The second reference PMOSFET MRP2 has a gate coupled to the gate of the first reference PMOSFET MRP1, and has a source coupled to the positive power supply $V_{CC}$. A drain of the second reference PMOSFET MRP2 is coupled to a drain of the first reference NMOSFET MRN1 at a node for generating the reference output voltage $V_{REF}$.

A gate and the drain of the first reference NMOSFET MRN1 are coupled together, and a source of the first reference NMOSFET MRN1 is coupled to a low power supply such as a ground node. The first and second reference PMOSFETs MRP1 and MRP2 and the first reference NMOSFET MRN1 each have the reference current $I_R$ flowing therethrough.

The gate and drain of the first reference PMOSFET MRP1 are coupled to a reference feed-back regulator 212 that stabilizes the reference bit voltage $V_{RBIT}$. In the example embodiment of FIG. 2, the reference feed-back regulator 212 is a differential amplifier comprised of second, third, and fourth reference NMOSFETs MRN2, MRN3, and MRN4, respectively, and third and fourth reference PMOSFETs MRP3 and MRP4, respectively.

Sources of the third and fourth reference PMOSFETs MRP3 and MRP4 are coupled to the positive power supply $V_{CC}$, and gates of the third and fourth reference PMOSFETs MRP3 and MRP4 are coupled together. A drain of the third reference PMOSFET MRP3 is coupled to a drain of the second reference NMOSFET MRN2, and a drain of the fourth reference PMOSFET MRP4 is coupled to a drain of the third reference NMOSFET MRN3. The gate and the drain of the fourth reference PMOSFET MRP4 are coupled together.

The drains of the third reference PMOSFET MRP3 and the second reference NMOSFET MRN2 are coupled to the gates of the first and second reference PMOSFETs MRP1 and MRP2. A gate of the second reference NMOSFET MRN2 has a regulation reference voltage VREG_REF applied thereon. A gate of the third reference NMOSFET MRN3 is coupled to the reference cell 208 such that the reference bit voltage $V_{RBIT}$ is applied thereon. Sources of the second and third reference NMOSFETs MRN2 and MRN3 are coupled together to a drain of the fourth reference NMOSFET MRN4.

The gate of the fourth reference NMOSFET MRN4 has a bias voltage $V_{BIAS}$ applied thereon, and the source of the fourth reference NMOSFET MRN4 is coupled to a low power supply such as the ground node. The bias voltage $V_{BIAS}$ at the gate of the fourth reference NMOSFET MRN4 sets the bias current through the reference MOSFETs MRP3, MRP4, MRN2, and MRN3 of the differential amplifier 212. In addition, the differential amplifier 212 acts to stabilize the reference bit voltage $V_{RBIT}$ by feed-back.

The core output voltage generator 204 includes a core front-end stage 216 comprised of an amplifier regulation transistor MCP1 coupled to a core cell 218 having a core current $(I_R+\Delta i)$ flowing there-through. The core current has a current deviation component $\Delta i$ offset from the reference current $I_R$. Such a current deviation component $\Delta i$ depends on the bit data stored in the core cell 218.

The core cell 218 is typically part of a memory device for example. A core bit voltage $V_{CBIT}$ is generated at a node for coupling a drain of the first amplifier PMOSFET MCP1 and the core cell 218. A source of the first amplifier PMOSFET MCP1 is coupled to a positive power supply $V_{CC}$.

The core output voltage generator 204 also includes a core back-end stage 220 coupled to the core front-end stage 216. The core back-end stage 220 is comprised of a second amplifier PMOSFET MCP2 and a first amplifier NMOSFET MCN1. The second amplifier PMOSFET MCP2 has a gate coupled to the gate of the first amplifier PMOSFET MCP1, and has a source coupled to the positive power supply $V_{CC}$. A drain of the second amplifier PMOSFET MCP2 is coupled to a drain of the first amplifier NMOSFET MCN1 at a node for generating the core output voltage $V_{CORE}$.

A gate and the drain of the first amplifier NMOSFET MCN1 are coupled together, and a source of the first amplifier NMOSFET MCN1 is coupled to a low power supply such as the ground node. The first and second amplifier PMOSFETs MCP1 and MCP2 and the first amplifier NMOSFET MCN1 each have the core current $(I_R+\Delta i)$ flowing there-through.

The gate and drain of the first amplifier PMOSFET MCP1 are coupled to a core feed-back regulator 222 that stabilizes the core bit voltage $V_{CBIT}$. In the example embodiment of FIG. 2, the core feed-back regulator 222 is a differential amplifier comprised of second, third, and fourth amplifier NMOSFETs MCN2, MCN3, and MCN4, respectively, and third and fourth amplifier PMOSFETs MCP3 and MCP4, respectively.

Sources of the third and fourth amplifier PMOSFETs MCP3 and MCP4 are coupled to the positive power supply $V_{CC}$, and gates of the third and fourth amplifier PMOSFETs MCP3 and MCP4 are coupled together. A drain of the third amplifier PMOSFET MCP3 is coupled to a drain of the second amplifier NMOSFET MCN2, and a drain of the fourth amplifier PMOSFET MCP4 is coupled to a drain of the third amplifier NMOSFET MCN3. The gate and the drain of the fourth amplifier PMOSFET MCP4 are coupled together.

The drains of the third amplifier PMOSFET MCP3 and the second amplifier NMOSFET MCN2 are coupled to the gates of the first and second amplifier PMOSFETs MCP1 and MCP2. A gate of the second amplifier NMOSFET MCN2 has the regulation reference voltage VREG_REF applied thereon. A gate of the third amplifier NMOSFET MCN3 is coupled to the core cell 218 such that the core bit voltage $V_{CBIT}$ is applied thereon. Sources of the second and third amplifier NMOSFETs MCN2 and MCN3 are coupled together to a drain of the fourth amplifier NMOSFET MCN4.

The gate of the fourth amplifier NMOSFET MCN4 has a bias voltage $V_{BIAS}$ applied thereon, and the source of the fourth amplifier NMOSFET MCN4 is coupled to a low power supply such as the ground node. The bias voltage $V_{BIAS}$ at the gate of the fourth amplifier NMOSFET MCN4 sets the bias current through the core MOSFETs MCP3, MCP4, MCN2, and MCN3 of the differential amplifier 222. In addition, the differential amplifier 222 acts to stabilize the core bit voltage $V_{CBIT}$ by feed-back.

Furthermore, the sense amplifier 200 includes a comparator 230 which is implemented as a differential amplifier for example. The comparator 230 has a positive input with the reference output voltage $V_{REF}$ applied thereon, and has a negative input with the core output voltage $V_{CORE}$ applied thereon. The comparator 230 generates the output signal OUT from comparing the core output voltage $V_{CORE}$ with the reference output voltage $V_{REF}$. The logical state of the output signal OUT indicates the bit data stored in the core cell 218.

In this manner, referring to FIG. 2, note that the core front-end stage 216 does not have any resistor in series with the voltage regulation transistor MCP1. Thus, the core bit voltage $V_{CBIT}$ may be relatively high near the high power supply voltage $V_{CC}$ with the voltage regulation transistor MCP1 still operating in saturation. In addition, the core output voltage $V_{CORE}$ is generated at the subsequent back-end stage 220 that is not directly coupled to the core cell 218. Thus, the core output voltage $V_{CORE}$ is not restricted from the core bit voltage $V_{CBIT}$ such that the core output voltage $V_{CORE}$ has higher voltage swing with the MOSFETs MCP1 and MCN1 still operating in saturation. Such higher voltage swing is advantageous for enhanced sensitivity of the sense amplifier 200.

In the sense amplifier 200 of FIG. 2:

$$\Delta V = V_{REF} - V_{CORE}; \text{ and}$$

$$\Delta V = \Delta i / g_{m1},$$

with $g_{m1}$ being the transconductance of each of the first reference and amplifier NMOSFETs MRN1 and MCN1.

In addition, the sense amplifier 200 of FIG. 2 has high signal to noise ratio for both balanced and unbalanced power-supply noise within the reference voltage generator 202 and the core output voltage generator 204. Balanced power-supply noise refers to noise at the power-supply that is present substantially equally within each of the reference voltage generator 202 and the core output voltage generator 204. Unbalanced power-supply noise refers to noise at the power-supply that is present unequally only in one of the reference voltage generator 202 and the core output voltage generator 204.

Referring to FIG. 2, if either balanced or unbalanced noise is present at the power supply $V_{CC}$ of the reference voltage generator 202, the effect of such noise appears at the source of the second reference PMOSMFET MRP2. In addition, a similar effect from such noise appears at the gate of the second reference PMOSMFET MRP2 through the reference feed-back regulator 212. Such effects at the source and the gate of the second reference PMOSFET MRP2 cancel each-other away to not have substantial effect on the reference output voltage $V_{REF}$.

Similarly, if either balanced or unbalanced noise is present at the power supply $V_{CC}$ of the core output voltage generator 204, the effect of such noise appears at the source of the second amplifier PMOSMFET MCP2. In addition, a similar effect from such noise appears at the gate of the second amplifier PMOSMFET MCP2 through the amplifier feed-back regulator 222. Such effects at the source and the gate of the second amplifier PMOSFET MCP2 cancel each-other away to not have substantial effect on the core output voltage $V_{CORE}$.

Figure 7:
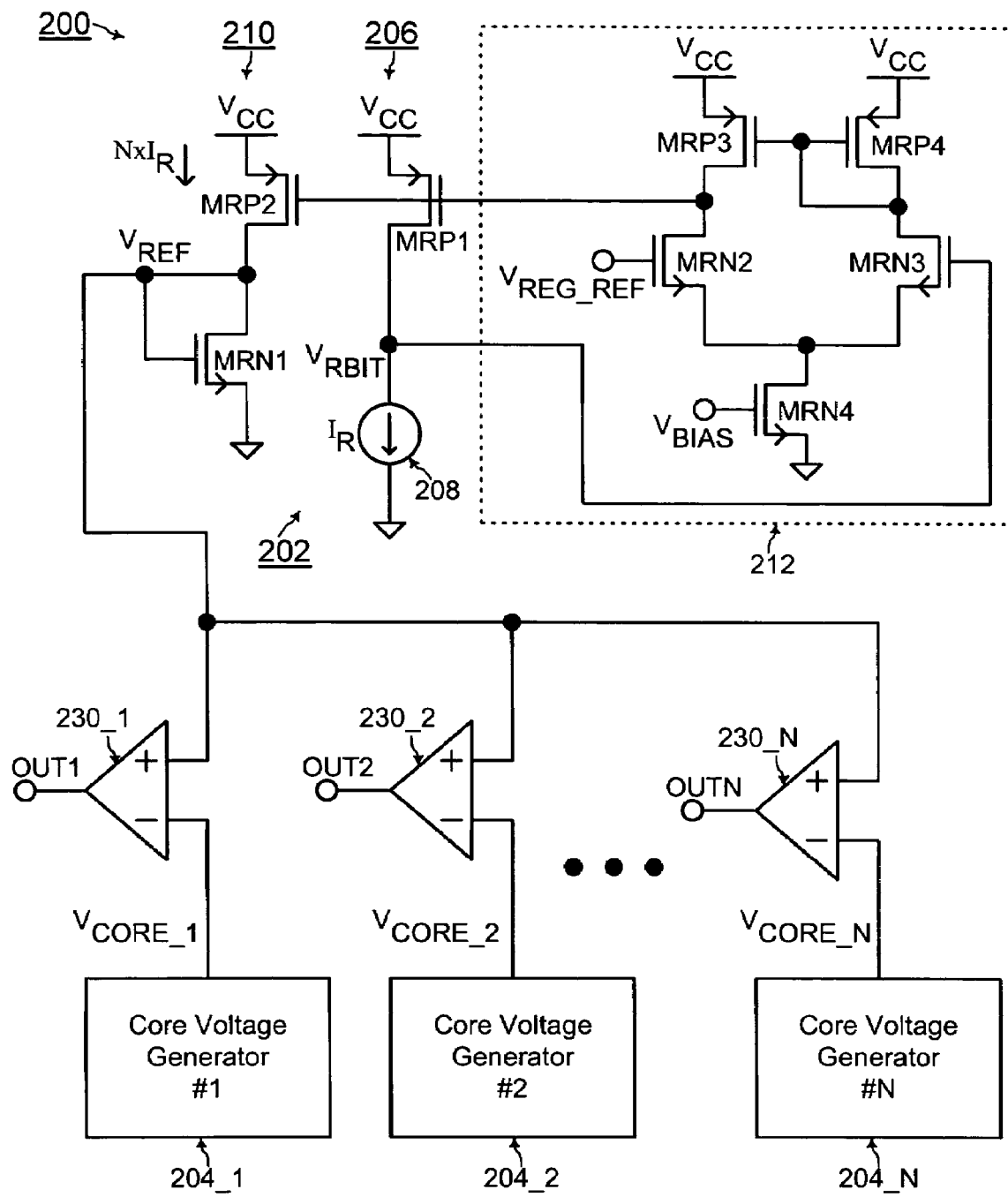
FIG. 7 shows modification of the sense amplifier of FIG. 2 for coupling a reference voltage generator to a plurality of core voltage generators, according to another embodiment of the present invention.

Furthermore, referring to FIG. 7, the MOSFETs of the reference voltage generator 202 may be appropriately sized such that the reference voltage generator 202 provides the reference output voltage $V_{REF}$ for a plurality of core output voltage generators. Referring to FIG. 7, the second reference PMOSFET MRP2 is sized with a W/L (width to length) ratio that is N times the W/L ratio of the first reference PMOSFET MRP1. Thus, a current of N×$I_R$ flows through the second reference PMOSFET MRP2.

Further referring to FIG. 7, the reference output voltage $V_{REF}$ from the reference voltage generator 202 is coupled to a respective positive input of N comparators 230_1, 230_2, . . . , and 230_N. Each of the N comparators 230_1, 230_2, . . . , and 230_N has a respective negative input coupled to a respective one of the core output voltage generators 204_1, 204_2, . . . , and 204_N, respectively. Each of the core output voltage generators 204_1, 204_2, . . . , and 204_N is implemented similarly to the core output voltage generator 204 of FIG. 2 to generate a respective one of the core output voltages $V_{CORE\_1}$, $V_{CORE\_2}$, . . . , and $V_{CORE\_N}$, respectively. Each of the comparators 230_1, 230_2 . . . , and 230_N compares a respective one of the core output voltages $V_{CORE\_1}$, $V_{CORE\_2}$, . . . , and $V_{CORE\_N}$, respectively, to the reference output voltage $V_{REF}$ for generating a respective output signal OUT1, OUT2, . . . , and OUTN.

In this manner, the reference voltage generator 202 is used for the plurality of core output voltage generators 204_1, 204_2, . . . , and 204_N for saving space of the integrated circuit of the sense amplifier 200 of FIG. 7. Furthermore, because a higher level of current N×$I_R$ flows through the second reference PMOSFET MRP2, the sense amplifier 200 of FIG. 7 operates at higher speed.

Figure 3:
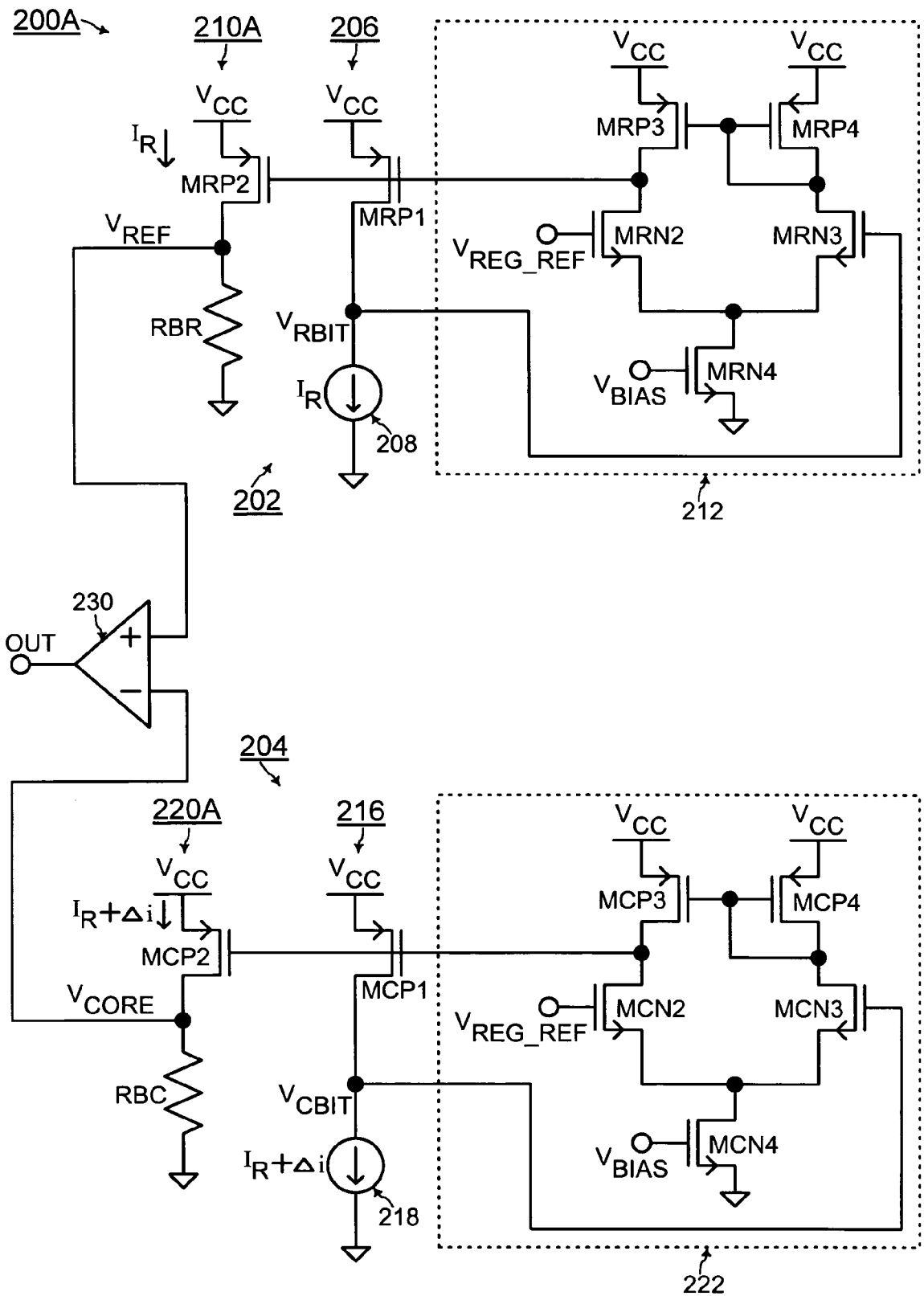
FIG. 3 shows modification to the sense amplifier of FIG. 2 using bias resistors instead of transistors, according to another embodiment of the present invention.

FIG. 3 shows a circuit diagram of a sense amplifier 200A according to another embodiment of the present invention. Elements having the same reference number in FIGS. 2 and 3 refer to elements having similar structure and function. Thus, the reference and core front-end stages 206 and 216 and the reference and core feed-back regulators 212 and 222 are substantially similar in FIGS. 2 and 3.

However, the reference and core back-end stages 210A and 220A of FIG. 3 are different from the reference and core back-end stages 210 and 220 of FIG. 2. Referring to FIG. 3, reference and amplifier bias resistors RBR and RBC, respectively, replace the first reference and amplifier NMOSFETs MRN1 and MCN1, respectively. Thus, the reference bias resistor RBR is coupled between the drain of the second reference PMOSFET MRP2 and the ground node, and the amplifier bias resistor RBC is coupled between the drain of the second amplifier PMOSFET MCP2 and the ground node.

The sense amplifier 200A of FIG. 3 operates similarly to the sense amplifier 200 of FIG. 2. If each of the reference and amplifier bias resistors RBR and RBC has a resistance value of R, then in the sense amplifier 200A of FIG. 3:

$$\Delta V = V_{REF} - V_{CORE}; \text{ and}$$

$$\Delta V = \Delta i * R.$$

Figure 8:
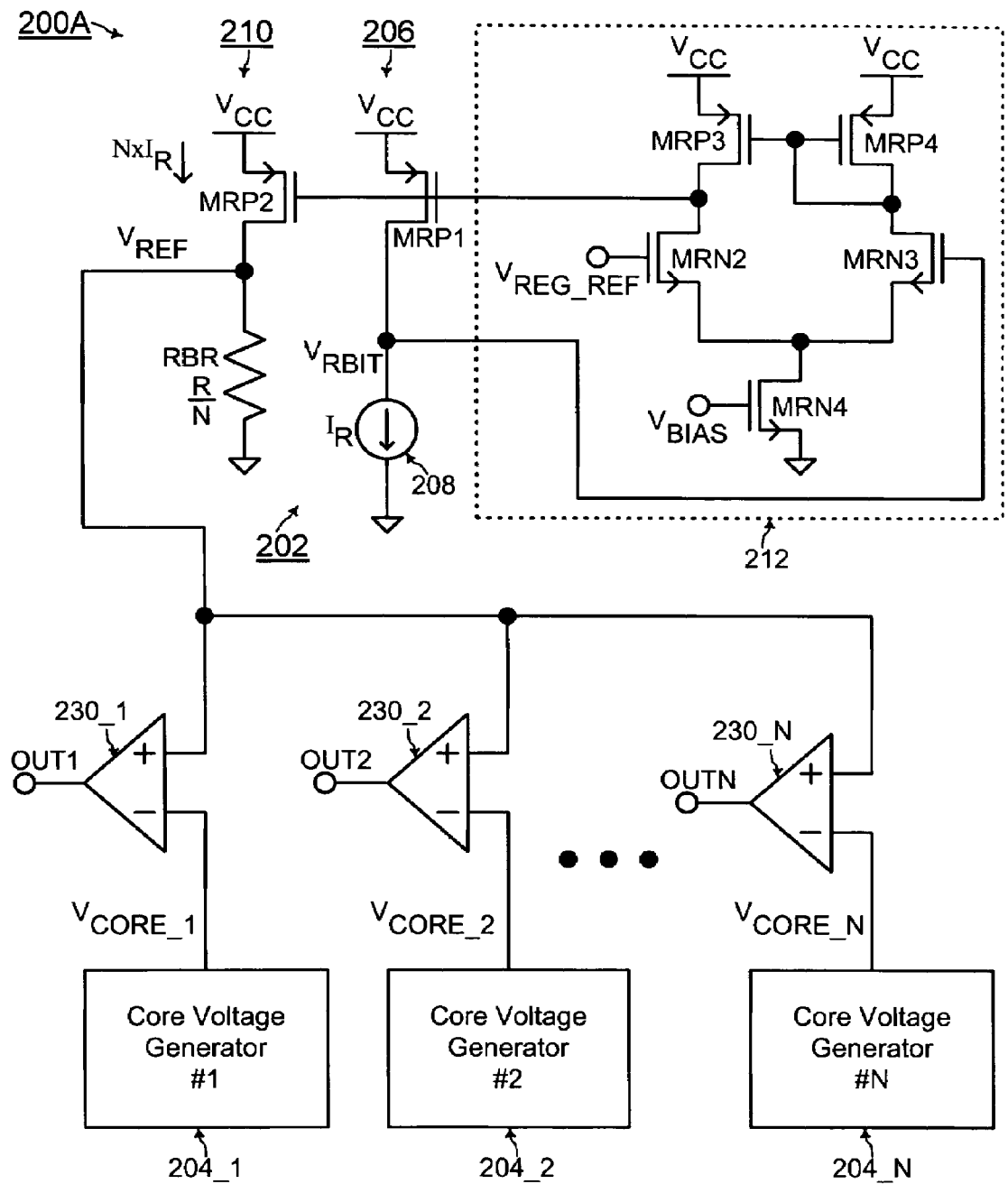
FIG. 8 shows modification of the sense amplifier of FIG. 3 for coupling a reference voltage generator to a plurality of core voltage generators, according to another embodiment of the present invention.

Similar to the sense amplifier 200 of FIG. 2, the sense amplifier 200A of FIG. 3 has high signal to noise ratio for both balanced and unbalanced noise within the reference voltage generator 202 and the core output voltage generator 204. Furthermore, referring to FIG. 8, the reference voltage generator 202 may be used for the plurality of core output voltage generators 204_1, 204_2, . . . , and 204_N. In FIG. 8, each of the core output voltage generators 204_1, 204_2, . . . , and 204_N is implemented similarly to the core output voltage generator 204 of FIG. 3.

In addition, the second reference PMOSFET MRP2 is sized with a W/L (width to length) ratio that is N times the W/L ratio of the first reference PMOSFET MRP1. In addition, the resistance value of the reference bias resistor RBR is R/N when the resistance value of the amplifier bias resistor RBC within each of the core output voltage generators 204_1, 204_2, . . . , and 204_N is R. Thus, a current of $N \times I_R$ flows through the second reference PMOSFET MRP2 in FIG. 8.

In this manner, the reference voltage generator 202 is used for the plurality of core output voltage generators 204_1, 204_2, . . . , and 204_N for saving space of the integrated circuit of the sense amplifier 200A of FIG. 8. Furthermore, because a higher level of current $N \times I_R$ flows through the second reference PMOSFET MRP2, the sense amplifier 200A of FIG. 8 operates at higher speed.

Figure 4:
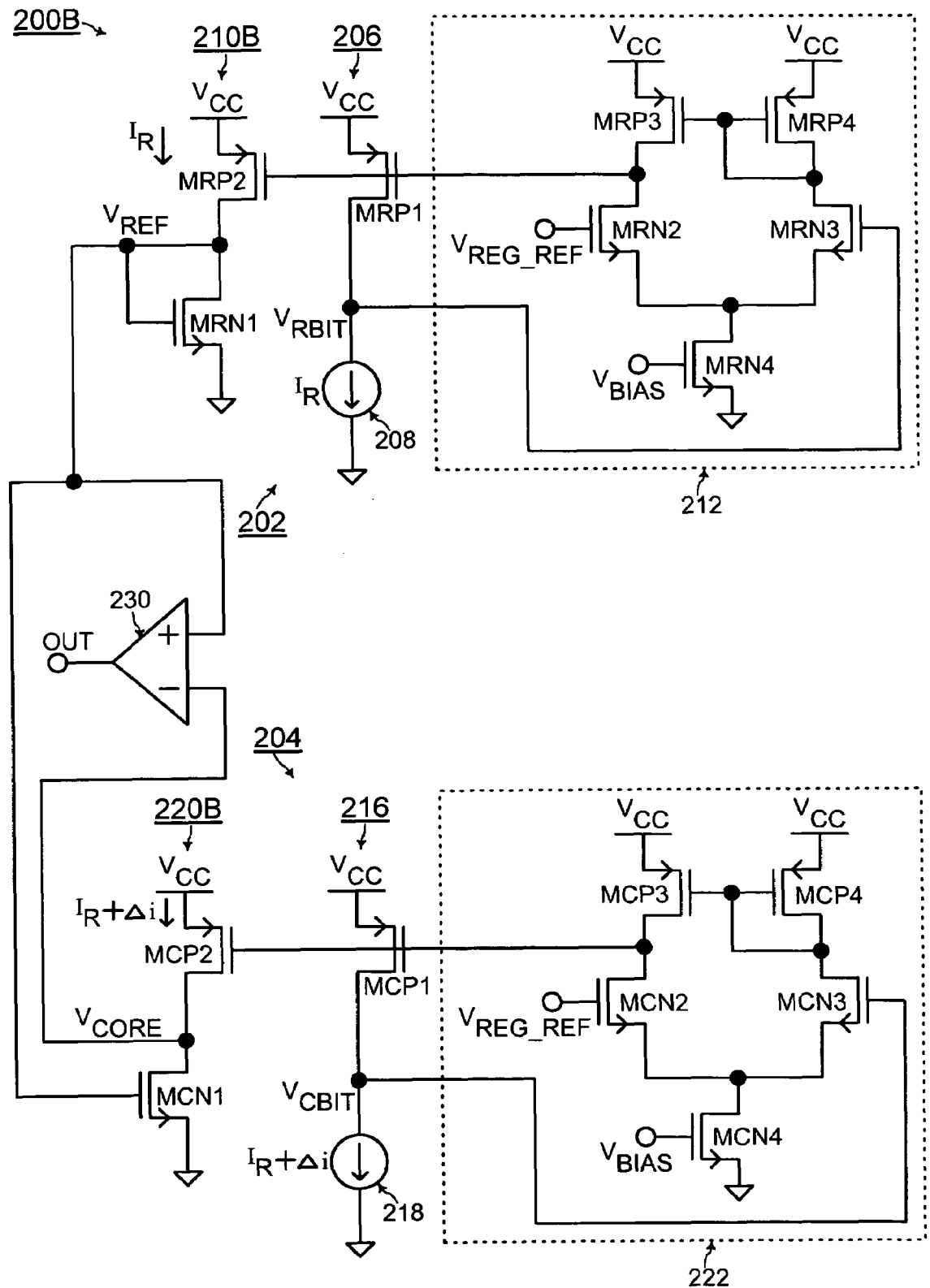
FIG. 4 shows modification of the sense amplifier of FIG. 2 with alternative connectivity of transistors, according to another embodiment of the present invention.

FIG. 4 shows a circuit diagram of a sense amplifier 200B according to another embodiment of the present invention. Elements having the same reference number in FIGS. 2 and 4 refer to elements having similar structure and function. Thus, the reference and core front-end stages 206 and 216 and the reference and core feed-back regulators 212 and 222 are substantially similar in FIGS. 2 and 4.

However, the reference and core back-end stages 210B and 220B of FIG. 4 are different from the reference and core back-end stages 210 and 220 of FIG. 2. Referring to FIG. 4, the reference output voltage $V_{REF}$ from the reference back-end stage 210B is also coupled to the gate of the first amplifier NMOSFET MCN1 of the core back-end stage 220B. In addition, the gate and the drain of the first amplifier NMOSFET MCN1 are not coupled together.

Instead, the drains of the first amplifier NMOSFET MCN1 and the second amplifier PMOSFET MCP2 are coupled together at a node that generates the core output voltage $V_{CORE}$ in FIG. 4. Such a node is coupled to the negative input of the comparator 230. Similar to the sense amplifier 200 of FIG. 2, the sense amplifier 200B of FIG. 4 also generates an output signal OUT at the output of the comparator 230 with a logical state that indicates the bit data stored in the core cell 218.

In addition referring to FIG. 4, the core front-end stage 216 does not have any resistor in series with the voltage regulation transistor MCP1. Thus, the core bit voltage $V_{CBIT}$ may be relatively high near the high power supply voltage $V_{CC}$ with the voltage regulation transistor MCP1 still operating in saturation. In addition, the core output voltage $V_{CORE}$ is generated at the subsequent back-end stage 220 that is not directly coupled to the core cell 218. Thus, the core output voltage $V_{CORE}$ is not restricted from the core bit voltage $V_{CBIT}$ such that the core output voltage $V_{CORE}$ has higher voltage swing with the MOSFETs MCP1 and MCN1 still operating in saturation. Such higher voltage swing is advantageous for enhanced sensitivity of the sense amplifier 200B.

Figure 5:
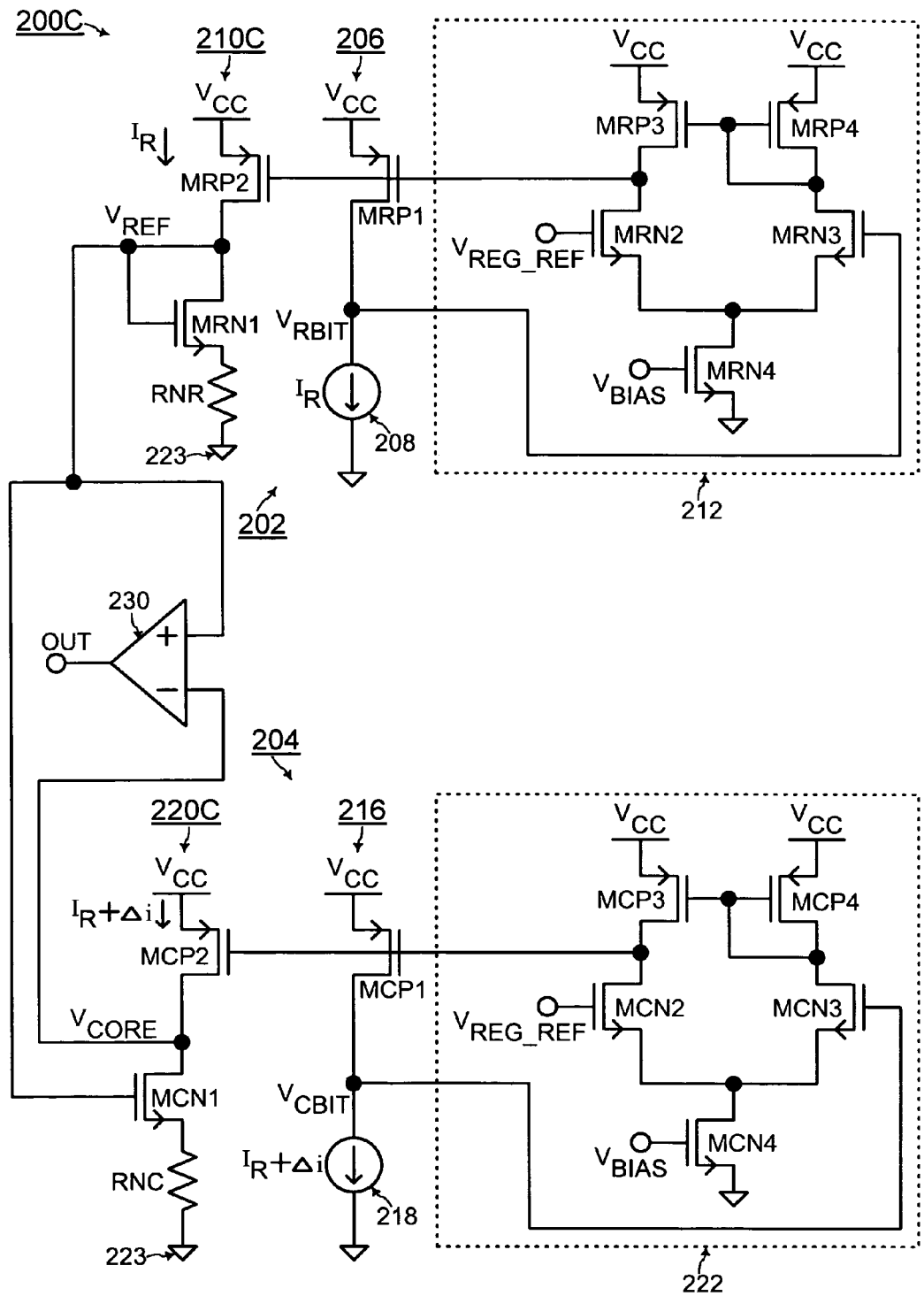
FIG. 5 shows modification of the sense amplifier of FIG. 4 with added source resistors for reducing effect of noise and mismatch of transistors, according to another embodiment of the present invention.

FIG. 5 shows a circuit diagram of a sense amplifier 200C according to another embodiment of the present invention. Elements having the same reference number in FIGS. 4 and 5 refer to elements having similar structure and function. Thus, the reference and core front-end stages 206 and 216 and the reference and core feed-back regulators 212 and 222 are substantially similar in FIGS. 4 and 5.

However, the reference and core back-end stages 210C and 220C of FIG. 5 are different from the reference and core back-end stages 210B and 220B of FIG. 4. Referring to FIGS. 4 and 5, in the sense amplifier 200C of FIG. 5, a reference noise immunity resistor RNR is coupled between the source of the first reference NMOSFET MRN1 and the ground node 223. Furthermore in the sense amplifier 200C of FIG. 5, an amplifier noise immunity resistor RNC is coupled between the source of the first amplifier NMOSFET MCN1 and the ground node 223.

Including such resistors RNR and RNC is advantageous for suppressing a noise or mismatch component $\Delta i'$ of $\Delta i$, resulting from noise at the ground node 223 or mismatch between the NMOSFETs MRN1 and MCN1. For example, assume that noise at the ground node 223 results in a voltage bounce of 20 milli-Volts at the ground node 223. In addition, assume that the transconductance $g_{ml}$ of each of the NMOSFETs MRN1 and MCN1 is about 1 milli-Amps/Volt. In that case, the noise component $\Delta i'$ from such voltage bounce is as follows in the sense amplifier 200B of FIG. 4:

$$\Delta i' = g_{ml} \times 20 \text{ milli-Volts} = 20 \text{ } \mu A.$$

In contrast, for the same voltage bounce at the ground node 223 in the sense amplifier 200C of FIG. 5, the noise component $\Delta i'$ is reduced from the resistors RNR and RNC as follows:

$$\Delta i' \approx 20 \text{ milli-Volts}/15 \text{ kilo-Ohms} = 1.3 \text{ } \mu A.$$

with each of the resistors RNR and RNC having a resistance value of 15 kilo-Ohms for example in FIG. 5. Thus, such resistors RNR and RNC reduce the effect of noise on $\Delta i$ in FIG. 5. The sense amplifier 200C of FIG. 5 may also be implemented with the ground node 223 being a low supply voltage source $V_{SS}$ instead. In that case, the resistors RNR and RNC reduce the effect of noise at the low supply voltage source $V_{SS}$ in FIG. 5.

Similarly, the NMOSFETs MRN1 and MCN1 may be mismatched from processing variations to have a difference in threshold voltage $\Delta V_{th}$ which may be 20 milli-Volts for example. The mismatch component $\Delta i'$ is similar as described above for the voltage bounce. Thus, the resistors RNR and RNC reduce the effect of such MOSFET mismatch on $\Delta i$ in FIG. 5. Otherwise, the sense amplifier 200C of FIG. 5 operates similarly to the sense amplifier 200B of FIG. 4.

Figure 6:
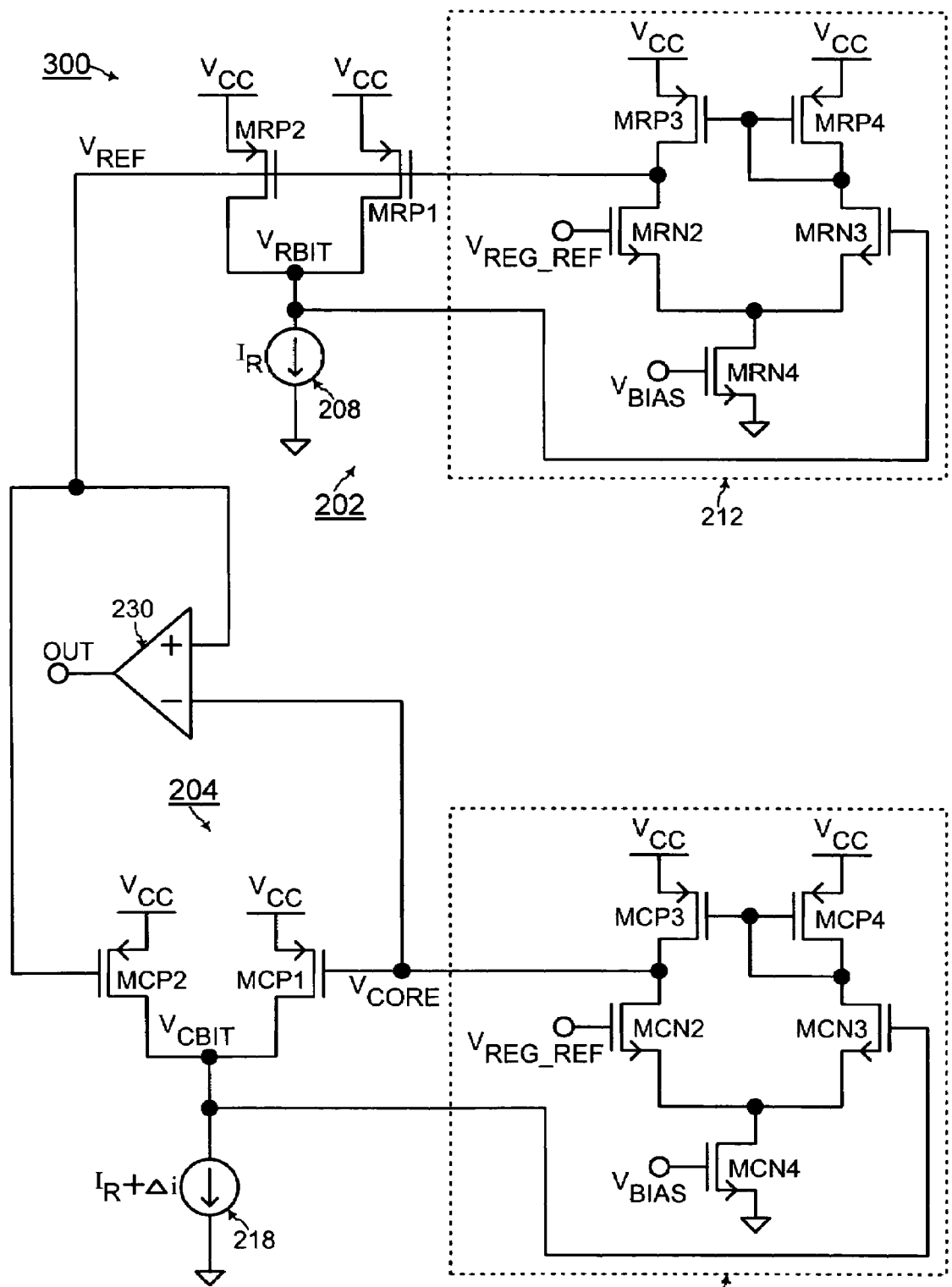
FIG. 6 shows a sense amplifier with a smaller sized transistor for high voltage swing, according to another embodiment of the present invention.

FIG. 6 shows a circuit diagram of a sense amplifier 300 according to another embodiment of the present invention. Elements having the same reference number in FIGS. 2 and 6 refer to elements having similar structure and function. Thus, the reference and core feed-back regulators 212 and 222 are substantially similar in FIGS. 2 and 6.

However, the sense amplifier 300 of FIG. 6 is not implemented with front-end and back-end stages. Rather, referring to FIG. 6, the reference voltage generator 202 includes a plurality of reference PMOSFETs MRP1 and MRP2 for collectively conducting the reference current $I_R$ through the reference cell 208. Thus, the sum of the currents through the reference PMOSFETs MRP1 and MRP2 is the reference current $I_R$ through the reference cell 208. The reference feed-back regulator 212 is coupled between the gates of the reference PMOSFETs MRP1 and MRP2 and the reference cell 208 for stabilizing the reference bit voltage $V_{RBIT}$.

Additionally referring to FIG. 6, the core output voltage generator 204 includes a plurality of amplifier PMOSFETs MCP1 and MCP2 for collectively conducting the core current ($I_R+\Delta i$) through the core cell 218. Thus, the sum of the currents through the amplifier PMOSFETs MCP1 and MCP2 is the core current ($I_R+\Delta i$) through the core cell 218.

Furthermore, the gates of the reference PMOSFETs MRP1 and MRP2 are coupled together to generate the reference voltage $V_{REF}$ applied on the positive input of the comparator 230 and on the gate of the second amplifier PMOSFET MCP2. The first amplifier PMOSFET MCP1 is a selected one of the plurality of amplifier PMOSFETs MCP1 and MCP2 having a gate for generating the core output voltage $V_{CORE}$ applied on the negative input of the comparator 230. The core feed-back regulator 222 is coupled between the gate of the first amplifier PMOSFET MCP1 and the core cell 218 for stabilizing the core bit voltage $V_{CBIT}$.

In an example embodiment of the present invention, the W/L ratio of the first reference and amplifier PMOSFETs MRP1 and MCP1 in FIG. 6 is minimized for higher voltage swing of the reference and core output voltages $V_{REF}$ and $V_{CORE}$. The equation for current conduction through a MOSFET is as follows:

$$I=k(W/L)(V_{GS}-V_{th})^2$$

with k being a constant, W/L being the width to length ratio, $V_{GS}$ being the gate to source voltage, and $V_{th}$ being the threshold voltage, of the MOSFET. When the W/L of the first amplifier PMOSFET MCP1 is minimized, the $V_{GS}$ of the first amplifier PMOSFET MCP1 changes more drastically with variation of the core current ($I_R+\Delta i$) through the core cell 218. Such higher variation of the $V_{GS}$ of the first amplifier PMOSFET MCP1 results in higher voltage swing of the core output voltage $V_{CORE}$ for the sense amplifier 300. Such higher voltage swing is advantageous for enhanced sensitivity of the sense amplifier 300.

In the sense amplifier 300 of FIG. 6:

$$\Delta V=V_{REF}-V_{CORE}; \text{ and}$$

$$\Delta V=\Delta i/g_{ml},$$

with $g_{ml}$ being the transconductance of each of the first reference and amplifier PMOSFETs MRP1 and MCP1.

Similar to the sense amplifier 200 of FIG. 2, the sense amplifier 300 of FIG. 6 also generates an output signal OUT at the output of the comparator 230 with a logical state that indicates the bit data stored in the core cell 218. In addition referring to FIG. 6, the plurality of amplifier PMOSFETs MCP1 and MCP2 doe not have any resistor in series such that the core bit voltage $V_{CBIT}$ may be relatively high near the high power supply voltage $V_{CC}$ with the plurality of transistors MCP1 and MCP2 still operating in saturation.

The foregoing is by way of example only and is not intended to be limiting. For example, the present invention is described for sensing the current level through the core cell 218 of a memory device. However, the present invention may also be used for sensing the current level when the core cell 218 is any other type of current conducting device. Thus, the terms "core current", "core output voltage generator", "core front-end state", "core back-end stage", "core feed-back regulator", and "core output voltage" as used herein is hereby generalized for sensing the current level through any type of current conducting device with the core cell 218 of a memory device being just one example.

In addition, the present invention herein is described for specific connections of the transistors in the example circuits of FIGS. 2, 3, 4, 5, 6, 7, and 8. However, the present invention may also be implemented with variation in the specific connections of the drain, source, and gate of the transistors. Furthermore, any dimensions or parameters specified herein are by way of example only. The present invention is limited only as defined in the following claims and equivalents thereof.

We claim:

1. A sense amplifier comprising:
   a reference voltage generator for generating a reference output voltage;
   a core output voltage generator for generating a core output voltage, the core output voltage generator including:
      a core front-end stage coupled to a current conducting device for converting a current through the current conducting device to a core bit voltage; and
      a core back-end stage coupled to the core front-end stage for converting the core bit voltage to the core output voltage having higher voltage swing from the core bit voltage;
   a comparator for generating an output signal from comparing the reference output voltage with the core output voltage;
   a plurality of core output voltage generators; and
   a plurality of comparators with each comparator being coupled to the reference output voltage generator for generating a respective output signal from comparing the reference output voltage to a respective core output voltage generated by a respective one of the core output voltage generators.

2. A sense amplifier comprising:
   a reference voltage generator for generating a reference output voltage;
   a core output voltage generator for generating a core output voltage, the core output voltage generator including:
      a core front-end stage coupled to a current conducting device for converting a current through the current conducting device to a core bit voltage; and
      a core back-end stage coupled to the core front-end stage for converting the core bit voltage to the core output voltage having higher voltage swing from the core bit voltage;
   an amplifier regulation transistor having a drain coupled to the current conducting device at a node having the core bit voltage generated thereon and having a source coupled to a power supply; and
   a core feed-back regulator coupled to a gate and the drain of the amplifier regulation transistor for maintaining the core bit voltage.

3. The sense amplifier of claim 2, wherein the core back-end stage includes:
   a first amplifier transistor having a gate coupled to the gate of the amplifier regulation transistor, and having a source coupled to the power supply; and a second amplifier transistor having a drain coupled to the drain of the first amplifier transistor, and having a gate and the drain coupled together at an output node with the core output voltage generated thereon.

4. The sense amplifier of claim 2, wherein the core back-end stage includes:
a first amplifier transistor having a gate coupled to the gate of the amplifier regulation transistor, and having a source coupled to the power supply; and
an amplifier bias resistor coupled between a drain of the first amplifier transistor and a ground node.

5. The sense amplifier of claim 2, wherein the core back-end stage includes:
a first amplifier transistor having a gate coupled to the gate of the amplifier regulation transistor, and having a source coupled to the power supply; and
a second amplifier transistor having a gate with the reference output voltage applied thereon, and having a source coupled to a ground node, and having a drain coupled to a drain of the first amplifier transistor at an output node with the core output voltage generated thereon.

6. The sense amplifier of claim 2, wherein the core back-end stage includes:
a first amplifier transistor having a gate coupled to the gate of the amplifier regulation transistor, and having a source coupled to the power supply; and
a second amplifier transistor having a gate with the reference output voltage applied thereon, and having a source coupled to a ground node via an amplifier noise immunity resistor, and having a drain coupled to a drain of the first amplifier transistor at an output node with the core output voltage generated thereon.

7. The sense amplifier of claim 2, wherein the reference voltage generator includes:
a reference front-end stage coupled to a reference cell for converting a reference current through the reference cell to a reference bit voltage; and
a reference back-end stage coupled to the reference front-end stage for converting the reference bit voltage to the reference output voltage.

8. The sense amplifier of claim 7, wherein the reference front-end stage includes:
a reference regulation transistor having a drain coupled to the reference cell at a node having the reference bit voltage generated thereon and having a source coupled to the power supply.

9. The sense amplifier of claim 7, wherein the reference front-end stage further includes:
a reference feed-back regulator coupled to a gate and the drain of the reference regulation transistor for maintaining the reference bit voltage.

10. The sense amplifier of claim 7, wherein the reference back-end stage includes:
a first reference transistor having a gate coupled to the gate of the reference regulation transistor and having a source coupled to the power supply; and
a second reference transistor having a drain coupled to a drain of the first reference transistor, and having a gate and the drain coupled together at an output node with the reference output voltage generated thereon.

11. The sense amplifier of claim 8, wherein the reference back-end stage includes:
a first reference transistor having a gate coupled to the gate of the reference regulation transistor and having a source coupled to the power supply; and
a second reference transistor having a drain coupled to a drain of the first reference transistor, having a gate and the drain coupled together at an output node with the reference output voltage generated thereon, and having a source coupled to a ground node.

12. The sense amplifier of claim 8, wherein the reference back-end stage includes:
a first reference transistor having a gate coupled to the gate of the reference regulation transistor and having a source coupled to the power supply; and
a reference bias resistor coupled between a drain of the first reference transistor and a ground node.

13. The sense amplifier of claim 8, wherein the reference back-end stage includes:
a first reference transistor having a gate coupled to the gate of the reference regulation transistor and having a source coupled to the power supply; and
a second reference transistor having a drain coupled to a drain of the first reference transistor, having a gate and the drain coupled together at an output node with the reference output voltage generated thereon, and having a source coupled to a ground node via a reference noise immunity resistor.

14. The sense amplifier of claim 2, further comprising:
a comparator for generating an output signal from comparing the reference output voltage with the core output voltage.

15. The sense amplifier of claim 2, wherein the current conducting device is a core cell of a memory device.

16. The sense amplifier of claim 2, wherein the core front-end stage includes the amplifier regulation transistor.

* * * * *